United States Patent [19]

Soneda

[11] 4,405,908

[45] Sep. 20, 1983

[54] FILTER CIRCUIT HAVING A CHARGE TRANSFER DEVICE

[75] Inventor: Mitsuo Soneda, Fujisawa, Japan

[73] Assignee: Sony Corporation, Tokyo, Japan

[21] Appl. No.: 255,161

[22] Filed: Apr. 17, 1981

[30] Foreign Application Priority Data

Apr. 11, 1980 [JP] Japan .................................. 55/48478
Apr. 15, 1980 [JP] Japan .................................. 55/49660
Sep. 16, 1980 [JP] Japan .................................. 55/128179
Sep. 26, 1980 [JP] Japan .................................. 55/134610

[51] Int. Cl.³ ..................... H03H 15/02; G11C 27/00; G11C 27/02
[52] U.S. Cl. ................................... 333/165; 333/173; 333/166; 377/61
[58] Field of Search ....................... 333/165, 166, 173; 357/24; 307/221 D, 221 R, 221 C, 221 B; 328/151, 165, 167; 377/57-63, 75-77, 80

[56] References Cited

U.S. PATENT DOCUMENTS 3,474,260 10/1969 Frohbach ..................... 307/221 D
3,740,577  6/1973 Sangster ...................... 307/221 D
3,916,219 10/1975 Wilmsmeyer ............. 307/221 D X Primary Examiner—Marvin L. Nussbaum
Attorney, Agent, or Firm—Lewis H. Eslinger; Alvin Sinderbrand

[57] ABSTRACT

A filter circuit comprising a charge transfer device of the type which includes first and second sets of charge storage devices, such as capacitors, the first and second sets of charge storage devices being supplied with first and second clock signals, respectively, and further including first and second sets of switches which are actuated in response to the first and second clock signals, respectively, each switch being operable, when actuated, to transfer charge between a charge storage device in one set and a charge storage device in the other set, thereby transferring a charge through succeeding switches to be temporarily stored in succeeding charge storage devices. A semiconductor element, such as a transistor, is actuated in response either to the first or to the second clock signals for transferring the charge stored in a first predetermined charge storage device to a second predetermined charge storage device. An output circuit is coupled to a preselected charge storage device for deriving an output signal from the filter circuit.

43 Claims, 15 Drawing Figures

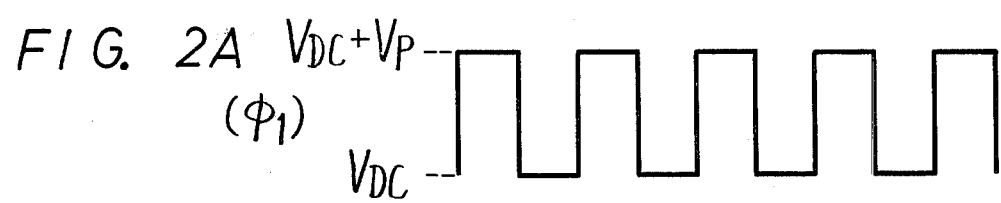
FIG. 2A $V_{DC}+V_P$
$(\phi_1)$ $V_{DC}$
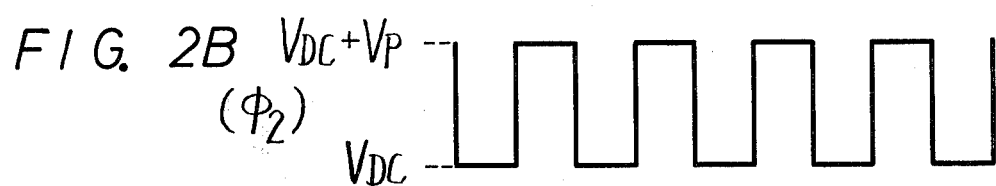
FIG. 2B $V_{DC}+V_P$
$(\phi_2)$ $V_{DC}$
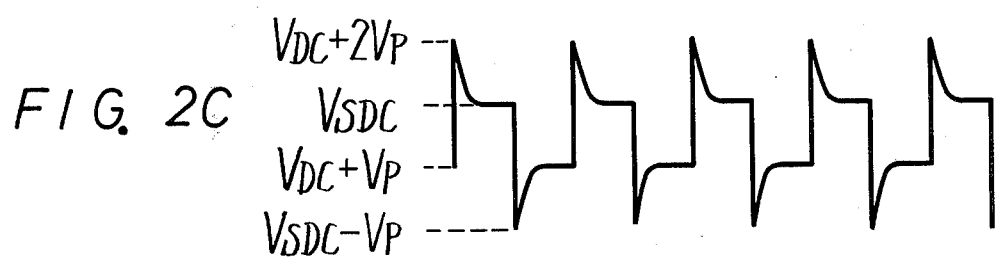
FIG. 2C $V_{DC}+2V_P$
$V_{SDC}$
$V_{DC}+V_P$
$V_{SDC}-V_P$
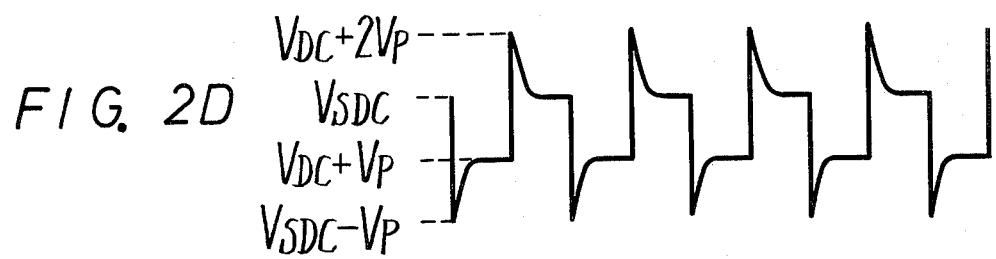
FIG. 2D $V_{DC}+2V_P$
$V_{SDC}$
$V_{DC}+V_P$
$V_{SDC}-V_P$

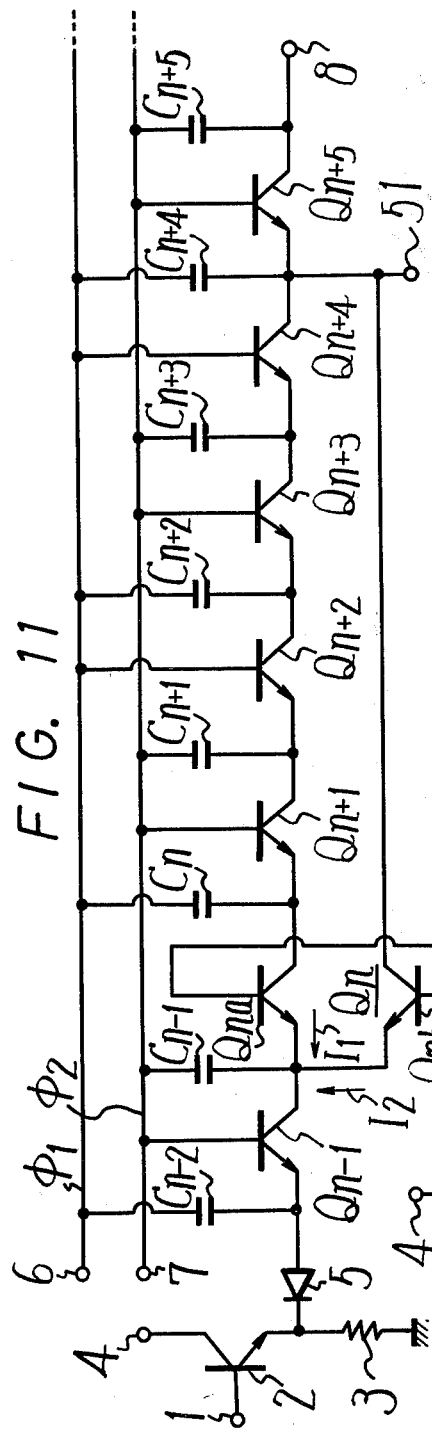

FILTER CIRCUIT HAVING A CHARGE TRANSFER DEVICE

BACKGROUND OF THE INVENTION

This invention relates to a filter circuit and, more particularly, to a filter circuit which includes a charge transfer device, such as a bucket brigade device.

Transversal filters, both recursive and non-recursive, have been formed of charge transfer devices, such as bucket brigade devices. In such a device, an input signal generally is supplied to a charge storage device, such as a capacitor, which is responsive to a clock signal supplied thereto to be charged to a level corresponding to a sampled level of the input signal. Thereafter, and in response to a next-following clock pulse, a switching element, such as a transistor, is rendered conductive to transfer the charge which had been stored on the aforementioned capacitor to a similar capacitor, or other charge storage device, in a next-following stage. Then, still another switching element, such as another transistor, is rendered conductive to transfer the charge from that capacitor to a succeeding capacitor. This operation continues, whereby the initially sampled signal level is transferred from stage-to-stage through the charge transfer device. Of course, while the initial sampled signal level is transferred in this manner, successive samples of the input signal are obtained and transferred in sequence. The charge transfer device thus functions as a time delay circuit, whereby suitable analog samples of the input signal "ripple" through the device.

Such a charge transfer device of the aforementioned type, which also is known as a bucket brigade device, has been used as a non-recursive transversal filter. The voltages produced as a function of the charges which are stored in different predetermined stages of the bucket brigade device are "tapped", or derived, suitably weighted, and summed to produce an output signal. Typically, the voltages produced at such predetermined stages of the bucket brigade device are supplied via emitter-follower transistor circuitry to the weighting circuits and, thence, are summed at an output. While such emitter-follower circuitry serves to isolate the weighting and output circuitry from the stages of the bucket brigade device, such emitter-follower circuitry has a deleterious affect upon the charge transfer device. For example, the collector-base capacitance of each emitter-follower transistor tends to reduce the effective pulse height of the clock pulses which are supplied to the bucket brigade device and which are necessary to transfer samples of the input signal therethrough. Furthermore, the base current drawn by the emitter-follower transistors has an undesirable influence on the charge transfer efficiency of the bucket brigade device. As a consequence of such emitter-follower circuitry, the dynamic range of the signal which can be filtered by using the charge transfer device is reduced.

When the aforementioned bucket brigade device is used to form a recursive transversal filter, emitter-follower circuitry is used to supply the voltages produced at predetermined stages of the bucket brigade device to weighting circuits, from which the "tapped", weighted voltages are summed and then sampled-and-held and fed back to, for example, the input of the bucket brigade device. Since this recursive transversal filter uses emitter-follower transistors, it suffers from many of the same disadvantages noted hereinabove in connection with the non-recursive transversal filter. In addition, the use of emitter-follower transistors, weighting circuits, analog summing circuits and sample-and-hold circuitry results in a relatively complicated, and thus expensive, arrangement, and also consumes a significant amount of electric power. Still further, if an unexpected transient, such as a current spike, passes through the emitter-follower circuitry, or through the analog summing circuit, or through the sample-and-hole circuit, such a current spike may be superimposed thereby onto the power supply or onto ground potential. This will adversely affect the various stages in the bucket brigade device. As yet another difficulty in the aforementioned recursive transversal filter, the DC potential of the voltages supplied to the emitter-follower circuitry often is not equal to the DC potential of the voltage which is fed back from the sample-and-hole circuit. As a result thereof, the filter circuit may be unstable.

OBJECTS OF THE INVENTION

Therefore, it is an object of the present invention to provide an improved transversal filter, comprised of a charge transfer device, which is free from the aforedescribed disadvantages of prior art filter circuits.

It is another object of the present invention to provide a transversal filter circuit, as aforementioned, which may function as a non-recursive transversal filter.

A further object of this invention is to provide a transversal filter of the type mentioned above, which is adapted to function as a recursive transversal filter.

An additional object of this invention is to provide a transversal filter of the type mentioned above, which is of relatively simple construction, and consumes minimal electric power, and exhibits stable operation.

Yet another object of this invention is to provide an improved transversal filter, as aforementioned, wherein the DC potentials provided at various stages of the charge transfer device included therein, are equal; and particularly, the output DC potential is equal to the DC potential provided at such stages.

A still further object of this invention is to provide a transversal filter, as aforementioned, wherein the transfer efficiency of the charge transfer device included therein is relatively high; and wherein the dynamic range of the filtered signal is relatively broad.

A still additional object of this invention is to provide a transversal filter, as aforementioned, which obviates the need for emitter-follower circuitry to derive, or tap, the voltages present at predetermined stages of the charge transfer device included therein.

Various other objects, advantages and features will become readily apparent from the ensuing detailed description, and the novel features will be particularly pointed out in the appended claims.

SUMMARY OF THE INVENTION

In accordance with this invention, a filter circuit is comprised of a charge transfer device of the type including first and second sets of charge storage elements, such as capacitors, the first set of such charge storage elements being supplied with a first clock signal and the second set of such charge storage elements being supplied with a second clock signal. The charge transfer device further includes first and second sets of switching elements, such as transistors, which are actuated in response to the first and second clock signals, respectively. When a switching element in the first set is actuated, it operates to transfer charge between a charge storage element in the first set and a charge storage element in the second set; and when a switching element in the second set is actuated, it operates to transfer charge between a charge storage element in the second set and a charge storage element in the first set; thereby resulting in the transfer of charge through succeeding switching elements to be temporarily stored in succeeding charge storage elements. A semiconductor device is interconnected between different stages of the charge storage elements, and is actuated in response to either the first or second clock signal for transferring charge between the charge storage elements to which it is connected. A preselected charge storage element is connected to an output circuit from which a filtered signal is derived.

BRIEF DESCRIPTION OF THE DRAWINGS

The following detailed description, given by way of example, will best be understood in conjunction with the accompanying drawings in which:

FIGS. 2A–2D are waveform diagrams which are useful in understanding the operation of the charge transfer device;

FIGS. 4 to 12 are schematic diagrams of various embodiments of the filter circuit in accordance with the present invention.

DETAILED DESCRIPTION OF PREFERRED EMBODIMENTS

Figure 1:
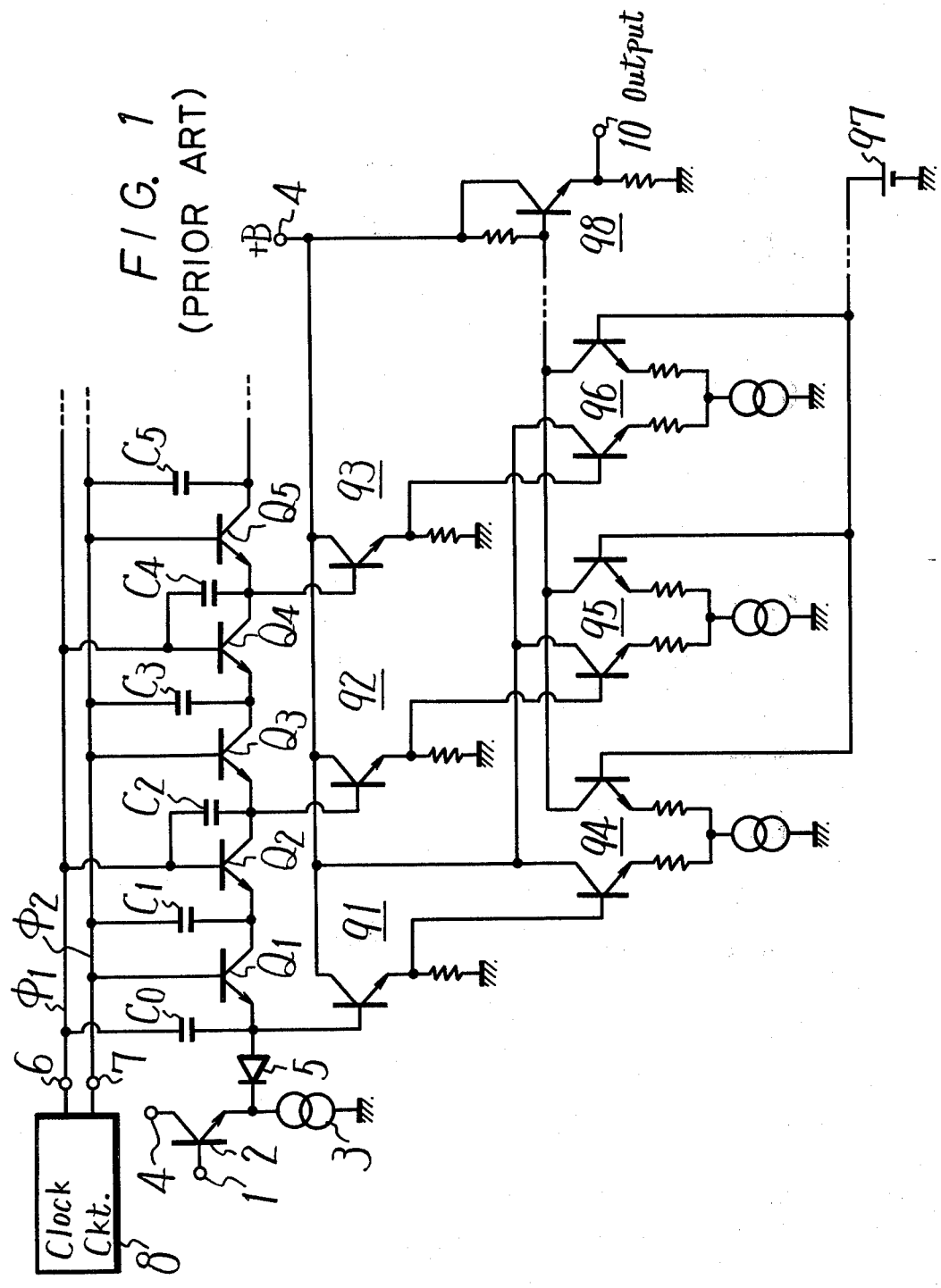
FIG. 1 is a schematic diagram of a non-recursive transversal filter comprised of a charge transfer device, and including emitter-follower circuitry.

Preferring now to the drawings, wherein like reference numerals are used throughout, an example of a non-recursive transversal filter using a bucket brigade device is shown in FIG. 1. An input terminal 1 is connected to the base of an NPN emitter follower transistor 2 whose emitter is coupled to a constant current source 3 and whose collector is connected to a suitable source of operating potential 4. The emitter of transistor 2 is further coupled to one electrode of a capacitor $C_0$, referred to herein as the signal electrode, through a backbiased diode 5. The other electrode of capacitor $C_0$ is connected to a clock terminal 6, and is referred to herein as the clock electrode. The signal electrode of capacitor $C_0$ is connected to the emitter of an NPN transistor $Q_1$ whose collector is, in turn, connected to the emitter of an NPN transistor $Q_2$ in the next-following stage. The collectors and emitters of NPN transistors $Q_2$, $Q_3$ ... in the succeeding stages are similarly connected. Each of capacitors $C_1$, $C_2$ ... is respectively connected between the collector and base of a corresponding transistor $Q_1$, $Q_2$, ... In the illustrated example, the capacitance values of capacitors $C_0$, $C_1$, $C_2$, ... are all equal and may be represented as C. Transistors $Q_1$, $Q_3$, ... have their bases connected in common to a clock terminal 7 of a clock circuit 8; and transistors $Q_2$, $Q_4$, ... have their bases connected in common to clock terminal 6 of the clock circuit.

Clock circuit 8 is a conventional circuit for generating clock signals $\Phi_1$ and $\Phi_2$, such as clock pulses, each of which is changed over between potentials $V_{DC}$ and $V_{DC}+V_P$, exhibits a duty ratio of 50% and the clock pulses are of opposite phase, as shown in FIGS. 2A and 2B. These clock pulses $\Phi_1$ and $\Phi_2$ are supplied to clock terminals 6 and 7, respectively. The relationship between voltages $V_P$ and $V_{DC}$, and the operating potential $V_{cc}$, may be expressed as:

$$V_{cc} > V_{DC} + 2V_P$$

The illustrated filter circuit is adapted to receive an input signal supplied to input terminal 1, and having a voltage magnitude $V_S$ that may be expressed as:

$$V_{DC}+V_p \leq V_S \leq V_{DC}+2V_p$$

In operation, initially, in the absence of an input signal, capacitors $C_0$, $C_1$, ... all are charged up to the clock pulse voltage level $V_p$. If an input voltage $V_S$ is supplied, it may be thought of as being separated into DC and AC components $V_{SDC}$ and $V_{SAC}$, respectively, with the AC component $V_{SAC}$ being equal to 0 initially. Accordingly, and as shown in FIG. 2C, the signal electrodes of those capacitors $C_0$, $C_2$, ... which are supplied with clock pulses $\Phi_1$ rise to the level $V_{DC}+2V_p$ and then gradually discharge to the input DC voltage level $V_{SDC}$ during the period in which the level of clock pulse $\Phi_1$ is equal to $V_{DC}+V_p$, and the signal electrodes of these capacitors fall to the level $V_{SDC}=V_p$ and then gradually discharge to the clock pulse level $V_{DC}+V_p$ during the period in which the level of clock pulse $\Phi_2$ is equal to $V_{DC}+V_p$. Conversely, and as shown in FIG. 2D, the electrodes of those capacitors $C_1$, $C_3$, ... which are supplied with clock pulses $\Phi_2$ abruptly fall to $V_{SDC}-V_p$ and then gradually discharge to the clock pulse level $V_{DC}+V_p$ during the period in which the level of clock pulse $\Phi_1$ is equal to $V_{DC}+V_p$, and the signal electrodes of these capacitors rise to $V_{DC}+2V_p$ and then gradually discharge to the input DC voltage level $V_{SDC}$ during the period in which the level of clock pulse $\Phi_2$ is $V_{DC}+V_p$. It is appreciated that the abrupt rise (and fall) of the voltage at the signal electrode of each capacitor is due to the fact that the voltage across a capacitor cannot change instantaneously. Therefore, when the clock electrode of the capacitor is supplied with the leading (or trailing) edge of the clock pulse $\Phi_1$ or $\Phi_2$, the voltage at the signal electrode abruptly rises (or falls) from its preceding, stable level, by an amount ($V_p$) equal to the change in the clock pulse voltage, and then gradually discharges to its steady level $V_{SDC}$ (or $V_{DC}+V_p$).

Let it be assumed that, during the positive half cycle of clock pulse $\Phi_1$, that is, during the period that the level of clock pulse $\Phi_1$ is $V_{DC}+V_p$, the input signal voltage $V_S$ is taken as $V_{S1}$. Consequently, the potential at the signal electrode of capacitor $C_0$ abruptly rises to $V_{DC}+2V_p$, as just described, and then gradually discharges to the input signal voltage $V_{S1}$. In other words, capacitor $C_0$ is discharged to store the charge of $[V_{S1}-(V_{DC}+V_p)]C$. This is illustrated in FIGS. 2C and 2D, if it is assumed that $V_{S1}=V_{SDC}$. During this positive half cycle of clock pulse $\Phi_1$, transistor $Q_1$ is OFF (i.e. non-conductive), so that no variation occurs in the voltage, or charge, of succeeding capacitors $C_1$, $C_2$ ....

During the next-following period, that is, during the half cycle in which the level of clock pulse $\Phi_2$ is $V_{DC}+V_p$ and the level of clock pulse $\Phi_1$ now is $V_{DC}$, the level of the clock pulse $\Phi_1$ returns to $V_{DC}$ so that the potential at the signal electrode of capacitor $C_0$ abruptly falls to $V_{S1}-(V_{DC}+V_p)+V_{DC}=V_{S1}-V_p$. Transistor $Q_1$ is turned ON during this positive half cycle of clock pulse $\Phi_2$, and it is seen from FIG. 2C that the voltage at the signal electrode of capacitor $C_0$ gradually discharges (increases) to the potential $(V_{DC}+V_p)$, which is the potential supplied to the base of transistor $Q_1$ by clock terminal 7. Transistor $Q_1$ operates in its active region so that capacitor $C_0$ charges through the path established from clock terminal 7, capacitor $C_1$, and the collector-emitter path of transistor $Q_1$ to capacitor $C_0$. The potential at the signal electrode of capacitor $C_0$ is changed from $V_{S1}-V_p$ to $V_{DC}+V_p$, and this change is attributed to the charge transferred thereto. This charge transfer is from capacitor $C_1$ to capacitor $C_0$ and may be expressed as follows:

$$[(V_{DC}+V_p)-(V_{S1}-V_p)]C=(V_{DC}+2V_p-V_{S1})C$$

where the left side of this equation represents the increase in charge transferred to capacitor $C_0$ and the right side of this equation represents the decrease in charge which is transferred from capacitor $C_1$.

The charge $V_p \cdot C$ initially is stored on capacitor $C_1$. Hence, after charge transfer from capacitor $C_1$ to capacitor $C_0$, the final charge on capacitor $C_1$ is expressed as follows:

$$V_p \cdot C - (V_{DC}+2V_p-V_{S1})C = [V_{S1}-(V_{DC}+V_p)]C$$

In other words, the voltage differential of $V_{S1}-(V_{DC}+V_p)$ at the signal electrode of capacitor $C_0$ which obtains during the positive half cycle of clock pulse $\Phi_1$ is transferred to capacitor $C_1$ during the positive half cycle of clock pulse $\Phi_2$, whereupon the potential of capacitor $C_0$ returns to $V_{DC}+V_p$. At this time, transistor $Q_2$ is OFF and, therefore, no variation in voltage or charge occurs in any of the succeeding capacitors $C_2$, $C_3$, ....

If, during the next positive half cycle of clock pulse $\Phi_1$, the input signal voltage $V_S$ admits of the magnitude $V_{S2}$, capacitor $C_0$ is charged to the level $V_{S2}-(V_{DC}+V_p)$, capacitor $C_1$ is discharged to $V_{DC}+V_p$ and capacitor $C_2$ is charged to $V_{S1}-(V_{DC}+V_p)$, the level to which capacitor $C_1$ previously had been charged. Transistor $Q_3$ now is OFF and, therefore, the voltages at succeeding capacitors $C_3$ ... are not changed.

The foregoing operation is repeated at succeeding clock periods, so that samples of the input signal will be transferred from left-to-right, that is, from capacitor $C_0$ to $C_1$ to $C_2$ to $C_3$ ... , in synchronism with clock pulses $\Phi_1$ and $\Phi_2$.

When the bucket brigade device formed of capacitors $C_0$, $C_1$, $C_2$ ... and transistors $Q_1$, $Q_2$, ... is used a plurality of intermediate taps are provided in the bucket brigade device to derive signals of different delay times. These signals are weighted with predetermined positive and negative values and summed at an output. For example, in FIG. 1, the signal electrodes of capacitors $C_0$, $C_2$ and $C_4$ are selected as such intermediate taps, and these signal electrodes are connected to the bases of emitter-follower NPN transistors 91, 92 and 93, respectively. The emitters of transistors 91, 92 and 93 are connected to corresponding input terminals of differential amplifiers 94, 95 and 96, respectively, these differential amplifiers having other input terminals connected in common to a source 97 of constant voltage. The output terminals of differential amplifiers 94, 95 and 96 are connected to a common output terminal 10 through an NPN emitter-follower transistor 98.

With this circuit arrangement, the signals derived at the respective intermediate taps of the bucket brigade device are supplied by respective emitter-follower circuits 91, 92 and 93, and added in an analog manner by differential amplifiers 94, 95 and 96. The respective signals are weighted by suitably selecting the gains of the individual differential amplifiers.

Figure 3:
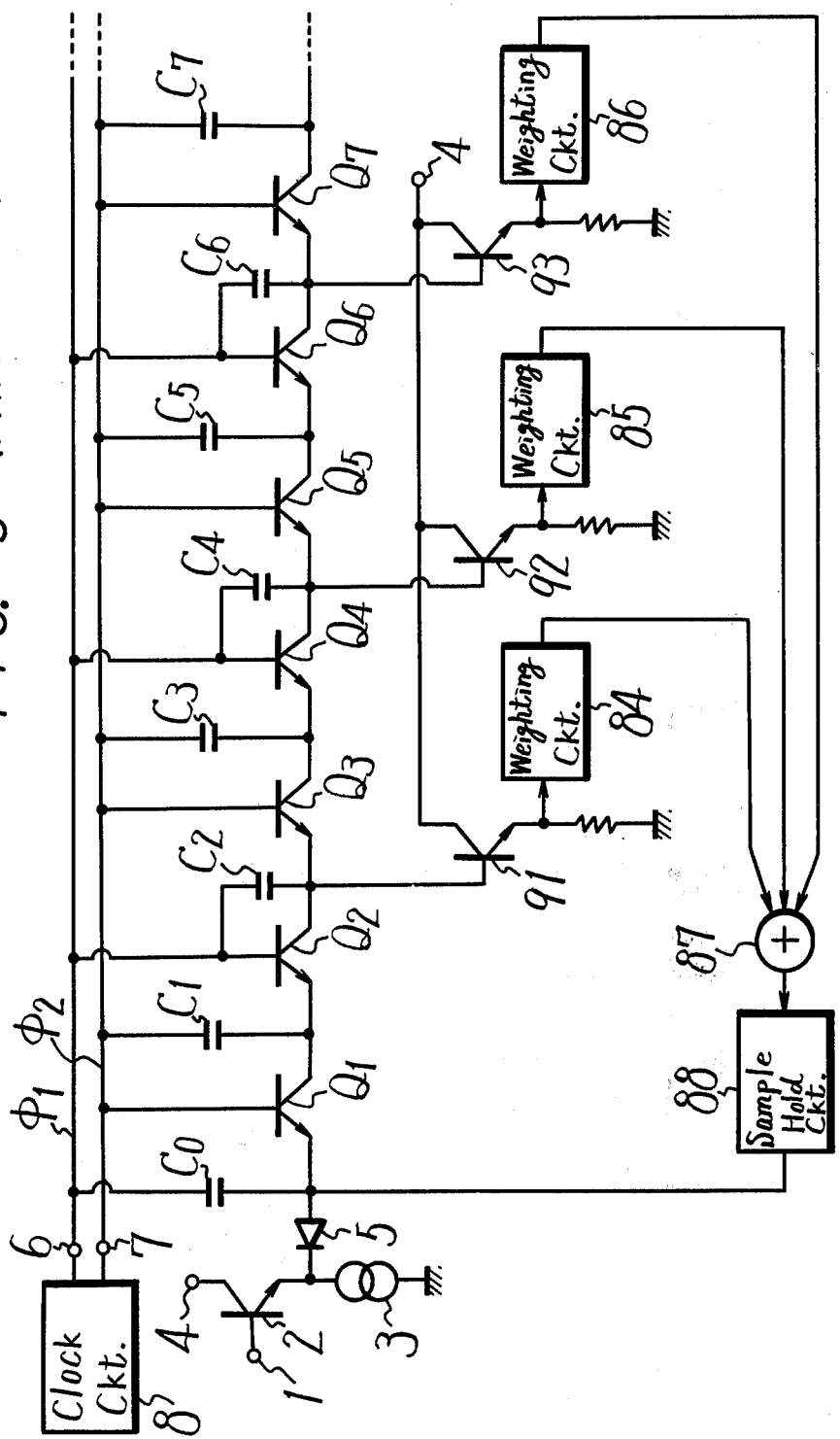
FIG. 3 is a schematic diagram of a recursive transversal filter comprised of a charge transfer device, and which includes emitter-follower circuitry.

The bucket brigade device of FIG. 1 may be used in a recursive transversal filter by feeding back the summed, weighted signals, derived from the intermediate taps, to a predetermined location in the bucket brigade device. One example of such a recursive transversal filter is shown in FIG. 3, wherein the signal electrodes of capacitors $C_2$, $C_4$ and $C_6$ are connected to emitter-follower circuits 91, 92 and 93, respectively. The outputs from these emitter-follower circuits are supplied by weighting circuits 84, 85 and 86, respectively, to an analog adding circuit 87, from which the summed signals are supplied to a sample-and-hold circuit 88 whose output terminal is fed back to the signal electrode of capacitor $C_0$.

In the example of FIG. 3, the signals derived from the respective intermediate taps are supplied by the emitter-follower circuits as voltages, weighted and then summed. The summed signal is injected into the first-stage capacitor $C_0$ of the bucket brigade device as a feedback charge.

Unfortunately, in transversal filters of the type shown in FIGS. 1 and 3, since emitter-follower circuits are used to derive the output, delayed signals provided at the taps of the bucket brigade device, the effective pulse height of the clock signal supplied to the respective capacitors is reduced because of the influence of the collector-base capacitance $C_{CB}$ of the emitter-follower transistor. Furthermore, in these circuits, the signal-transfer efficiency from stage to stage is deteriorated, and the dynamic range of the filtered signal is lowered, because of the base currents of the emitter-follower.

Also, when an analog adder and a sample-and-hold circuit are used, as in the circuit of FIG. 3, a large number of elements is necessary, thereby increasing the cost of the filter circuit, and a significant amount of electric power is consumed.

In addition, the transition in the voltage at the signal electrodes of the capacitors may induce a transient, or spike, current to flow through one or more of the emitter-follower circuits, analog adder and sample-and-hold circuit, which adversely affects the other circuits through the power source and ground potentials supplied thereto.

Moreover, it is very difficult to maintain equal, stable DC potentials between the inputs of the emitter-follower circuit and the output of the sample-and-hold circuit for improved circuit performance.

Figure 4:
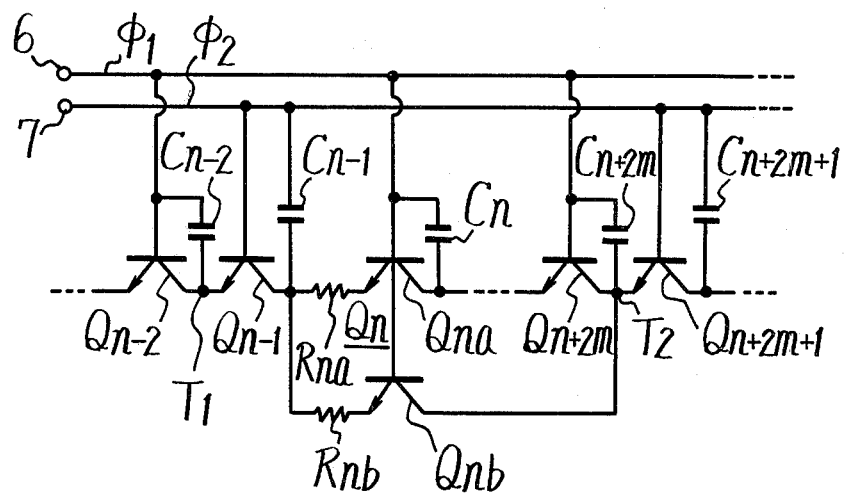

The foregoing disadvantages are overcome by the present invention, one embodiment of which is illustrated in FIG. 4 as a comb type or line filter which is one example of a non-recursive transversal filter. In this embodiment, the charge transfer device is comprised of one set of capacitors $C_{n-2}$, $C_n$, ... $C_{n+2m}$ having their clock electrodes connected to clock terminal 6 to receive clock pulses $\Phi_1$, and a set of capacitors $C_{n-1}$, $C_{n+1}$, ... $C_{n+2m+1}$ having their clock electrodes connected to clock terminal 7 to receive clock pulses $\Phi_2$. The clock electrode of each capacitor $C_{n-2}$, $C_{n-1}$, $C_n$, ... $C_{n+2m}$, $C_{n+2m+1}$ is connected to the base of a corresponding transistor $Q_{n-2}$, $Q_{n-1}$, $Q_n$, ... $Q_{n+2m}$, $Q_{n+2m+1}$, and the signal electrode of that capacitor is connected to the collector of its corresponding transistor. Clock pulses $\Phi_1$ and $\Phi_2$ are of the type shown in FIGS. 2A and 2B, and signal levels are transferred from one capacitor to the next, in left-to-right direction, in the manner described above. In FIG. 4, transistor $Q_n$ is comprised of two separate transistors $Q_{na}$ and $Q_{nb}$. A resistor $R_{na}$ is connected between the emitter of transistor $Q_{na}$ and the signal electrode of preceding capacitor $C_{n-1}$. This junction is connected through a resistor $R_{nb}$ to the emitter of transistor $Q_{nb}$. The bases of transistors $Q_{na}$ and $Q_{nb}$ are connected in common to clock terminal 6. The collector of transistor $Q_{nb}$ is connected to the signal electrode of capacitor $C_{n+2m}$, which is disposed in a subsequent, or succeeding stage from that of transistor $Q_{nb}$. That is, capacitor $C_{n+2m}$ is separated from transistor $Q_{nb}$ by 2m stages. The purpose of resistors $R_{na}$ and $R_{nb}$ is to provide current balance (e.g. equal currents) through transistors $Q_{na}$ and $Q_{nb}$, and these resistors may be omitted if such balance between transistors $Q_{na}$ and $Q_{nb}$ is maintained by forming such transistors with appropriate (e.g. equal) emitter areas.

In the embodiment shown in FIG. 4, during the positive half cycle of clock pulse $\Phi_1$, transistors $Q_{na}$ and $Q_{nb}$ both turn ON and charge is transferred through both transistors from capacitor $C_{n-1}$. Since transistors $Q_{na}$ and $Q_{nb}$ are balanced, as mentioned above, the charges flowing therethrough are equal. Hence, one-half of the total charge transferred from capacitor $C_{n-1}$ is supplied to capacitor $C_n$, and the other half of this total charge is supplied to capacitor $C_{n+2m}$. It is appreciated that, in accordance with its bucket brigade operation, the charge transferred to capacitor $C_n$ is shifted, during successive clock pulse periods, from stage to stage, in the left-to-right direction, to capacitor $C_{n+2m}$. In particular, this charge is transferred to capacitor $C_{n+2m}$ in m clock pulse periods, resulting in a transfer time delay of $m\tau$ (where $\tau$ is one clock period $= 1/f_c$ and $f_c$ is the clock frequency), at the positive half cycle of the mth clock pulse $\Phi_1$.

The transfer function $H_1(z)$ from the signal electrode of capacitor $C_{n-2}$ (shown as tap $T_1$) to that of capacitor $C_{n+2m}$ (shown as tap $T_2$) for the embodiment of FIG. 4 may be expressed as:

$$H_1(z) = z^{-1} \cdot \tfrac{1}{2}(1 + z^{-m}) \tag{1}$$

wherein $z^{-1} = \epsilon^{-j\omega\tau}$, where $\omega = 2\pi f$ and f is the frequency of the input signal. Thus, the circuit of FIG. 4 exhibits the transfer function of a comb line filter.

It is clear, from FIG. 4, that a substantial number of circuits, such as the emitter-follower circuits, the differential amplifiers and the like, are unnecessary. Consequently, the number of requisite circuit elements is reduced; and power consumption also is reduced. Further, it will be appreciated that the DC potentials (when $\omega = 0$; $Z^{-1} = 1$) at taps $T_1$ and $T_2$ are equal, thereby improving the coupling characteristic of the circuit. Also, the charge transferred through transistor $Q_{nb}$ to capacitor $C_{n+2m}$ is substantially identical to the charge transfer through a conventional bucket brigade device, so that no spike current is present. Therefore, the power source voltage does not fluctuate because of such current spikes, and other circuit elements are not deleteriously influenced. Since there is no need to provide emitter-follower output circuits, the problem of modulated transfer efficiency due to the base current of the emitter-follower transistor and the problem of reduced effective clock pulse height due to the collector-base capacitance of the emitter-follower transistor, thereby lowering the dynamic range of the signal, are avoided.

Thus, the non-recursive transversal filter of the present invention is of relatively simple circuit construction and is free from the defects attending the previously described filter circuit.

In the circuit of FIG. 4, if the capacitance of each of the capacitors $C_n$ to $C_{n+2m-1}$ is equal to C/2, the DC potentials of these capacitors will be equal to the DC potential at those capacitors that are in upstream stages which precede tap $T_1$, and also will be equal to the DC potentials at those capacitors that are in downstream stages which follow tap $T_2$. Hence, signal transfer is further stabilized.

Figure 5:
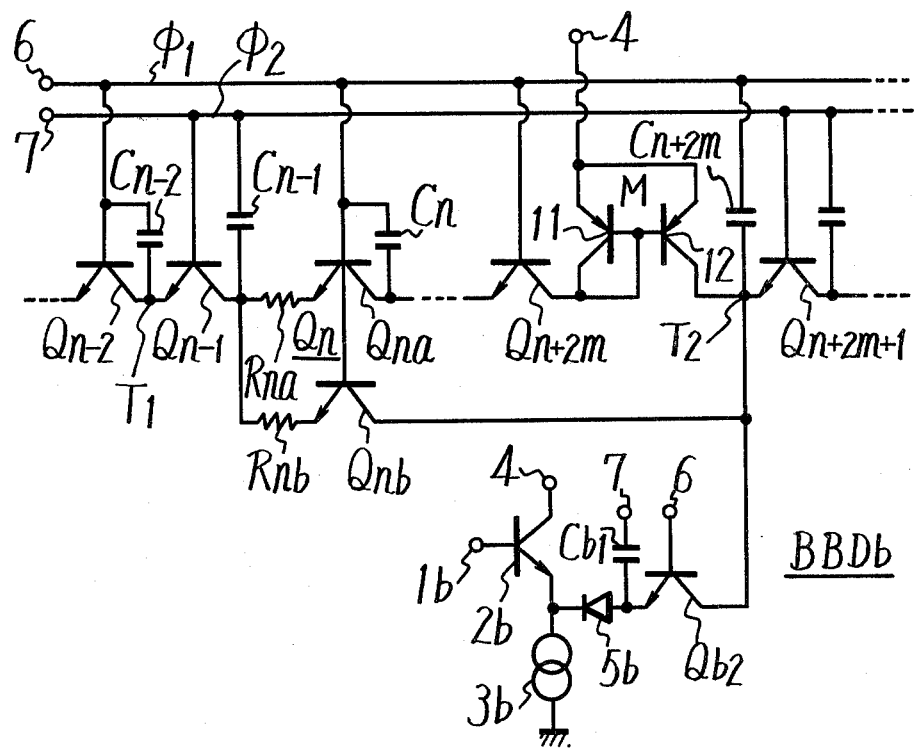

FIG. 5 illustrates another embodiment of the invention, in which the transversal filter therein exhibits the characteristics of a comb line filter. In this embodiment, the collector of transistor $Q_{n+2m}$ is coupled to the signal electrode of capacitor $C_{n+2m}$ through a current mirror circuit M comprised of transistors 11 and 12. Transistor 11 has its base and collector connected in common to the collector of transistor $Q_{n+2m}$, and its emitter connected to power supply terminal 4. Transistor 12 has its base connected to the base of transistor 11, its emitter connected to power supply terminal 4, and its collector connected to the signal electrode of capacitor $C_{n+2m}$.

The embodiment of FIG. 5 includes transistors $Q_{na}$, $Q_{nb}$ and resistors $R_{na}$, $R_{nb}$ connected in a manner similar to that described above in connection with FIG. 4. Another bucket brigade device $BBD_b$ is provided, having an input terminal $1b$ to which the DC component $V_{SDC}$ of the input signal $V_S$ is applied. Bucket brigade device $BBD_b$ includes a capacitor $C_{b1}$, similar to capacitor $C_0$ of the aforedescribed devices, whose signal electrode is connected through the emitter-collector circuit of a transistor $Q_{b2}$ to the signal electrode of capacitor $C_{n+2m}$.

With the circuit shown in FIG. 5, the charge which is transferred through transistor $Q_{n+2m}$, when this transistor is turned ON by clock pulse $\Phi_1$, is inverted in current mirror circuit M and then injected into capacitor $C_{n+2m}$. It is seen that the charge which flows through transistor $Q_{nb}$ is a function of the charge on capacitor $C_{n+2m}$. Therefore, in this circuit, the transfer function $H_2(z)$ from tap $T_1$ to tap $T_2$ differs from transfer function $H_1(z)$, expressed in equation (1), and may be represented as:

$$H_2(z) = Z^{-1} \cdot \tfrac{1}{2}(1 - Z^{-m}) \tag{2}$$

Further, the DC component of the input signal is cancelled between transistors 12 and $Q_{nb}$ so that the only DC component which is present at tap $T_2$ is the component $V_{SDC}$ supplied from bucket brigade device $BBD_b$. The operation and effect of the circuit shown in FIG. 5 is substantially the same as that of the circuit discussed above in connection with FIG. 4.

Figure 6:
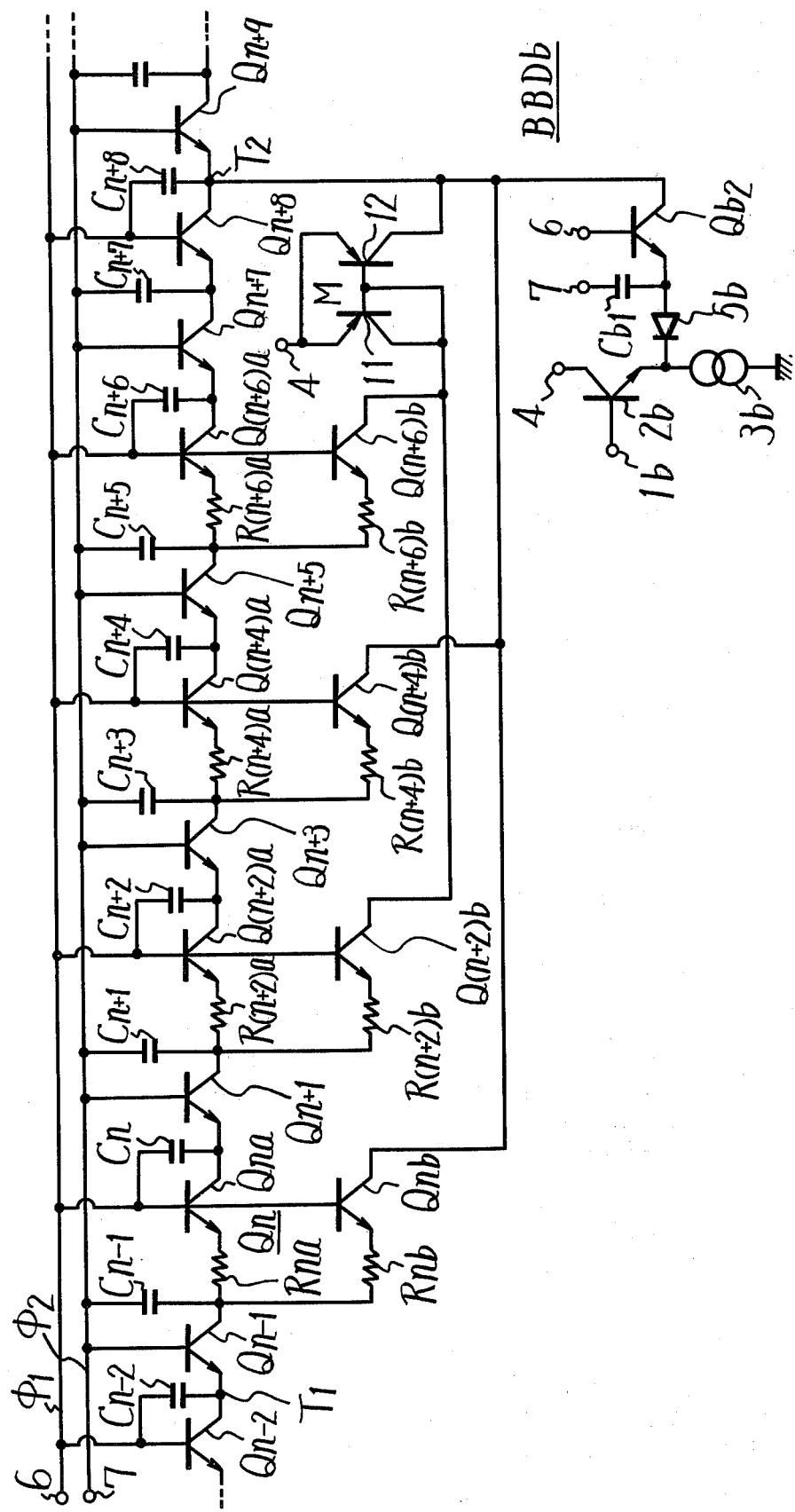

Turning now to FIG. 6, there is illustrated another embodiment of the invention which is adapted to weight the signals provided at selected ones of the intermediate taps with respective values and also is adapted to provide positive and negative signs to the factors constituting the transfer function. As illustrated, the signal electrodes of capacitors $C_{n-1}$, $C_{n+1}$, $C_{n+3}$ and $C_{n+5}$ (for example, the odd-numbered capacitors) are connected through resistors $R_{na}$, $R_{(n+2)a}$, $R_{(n+4)a}$ and $R_{(n+6)a}$ to the emitters of transistors $Q_{na}$, $Q_{(n+2)a}$, $Q_{(n+4)a}$ and $Q_{(n+6)a}$, respectively. The signal electrodes of these capacitors also are connected through resistors $R_{nb}$, $R_{(n+2)b}$, $R_{(n+4)b}$ and $R_{(n+6)b}$ to the emitters of transistors $Q_{nb}$, $Q_{(n+2)b}$, $Q_{(n+4)b}$ and $Q_{(n+6)b}$, respectively. The collectors of transistors $Q_{nb}$ and $Q_{(n+4)b}$ are connected in common to the signal electrode of capacitor $C_{n+8}$, and the collectors of the transistors $Q_{(n+2)b}$ and $Q_{(n+6)b}$ are connected in common through current mirror circuit M to this capacitor. As in the FIG. 5 embodiment, an additional bucket brigade device $BBD_b$ is provided, having a transistor $Q_{b2}$ whose collector is connected to the signal electrode of capacitor $C_{n+8}$.

In the embodiment of FIG. 6, the charges which flow through transistors $Q_{nb}$ and $Q_{(n+4)b}$ are supplied to capacitor $C_{n+8}$, and the charges which flow through transistors $Q_{(n+2)b}$ and $Q_{(n+6)b}$ are inverted and then injected into capacitor $C_{n+8}$ by current mirror M. The transfer function $H_3(z)$ of this circuit, from tap $T_1$ to tap $T_2$ may be expressed as:

$$H_3(z) = a'_n Z^{-1} - a'_{n+2} Z^{-2} + a'_{n+4} Z^{-3} - a'_{n+6} Z^{-4} + a'_{n+8} Z^{-5} \quad (3)$$

where $$a'_n = \frac{r_{na}}{r_{na} + r_{nb}}$$

$$a'_{n+2} = (1 - a'_n) \frac{r_{(n+2)a}}{r_{(n+2)a} + r_{(n+2)b}}$$

$$a'_{n+4} = (1 - a'_n - a'_{n+2}) \frac{r_{(n+4)a}}{r_{(n+4)a} + r_{(n+4)b}}$$

$$a'_{n+6} = (1 - a'_n - a'_{n+2} - a'_{n+4}) \frac{r_{(n+6)a}}{r_{(n+6)a} + r_{(n+6)b}}$$

$$a'_{n+8} = (1 - a'_n - a'_{n+2} - a'_{n+4} - a'_{n+6})$$

If the capacitance $C_0$ of capacitor $C_{b1}$ is selected as:

$$C_0 = 2(a'_{n+2} + a'_{n+6})C \quad (4)$$

the DC potentials at the signal electrodes of the respective capacitors become equal.

The operation and effect of the circuit shown in FIG. 6 is substantially the same as that shown in FIG. 4.

An example of a recursive transversal filter in accordance with the present invention now will be described with reference to FIG. 7. This embodiment employs a positive feedback.

Figure 7:
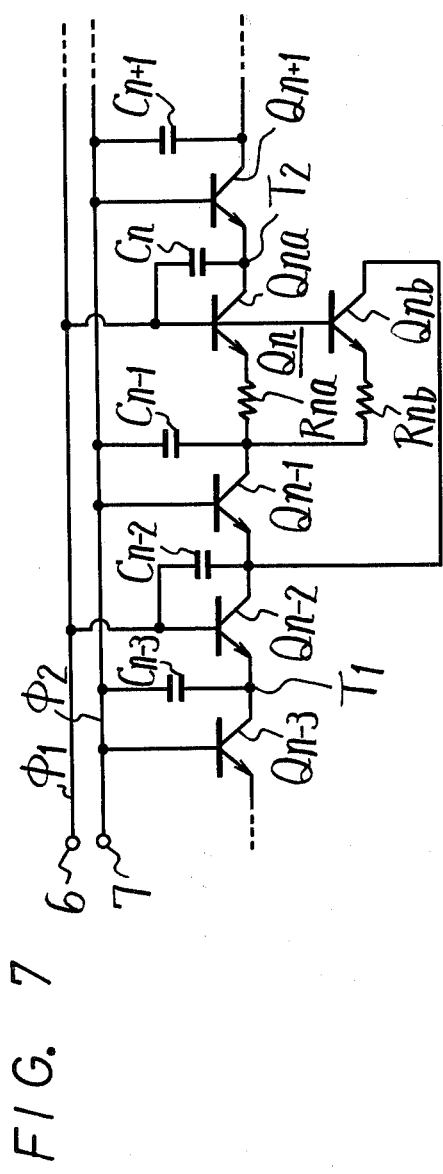

In FIG. 7, resistor $R_{na}$ is connected between the emitter of transistor $Q_{na}$ and signal electrode of capacitor $C_{n-1}$. The signal electrode of capacitor $C_{n-1}$ also is connected to the emitter of a transistor $Q_{nb}$ through resistor $R_{nb}$. The bases of transistors $Q_{na}$ and $Q_{nb}$ are connected in common to clock terminal 6. Transistor $Q_{nb}$ also has its collector connected to the signal electrode of capacitor $C_{n-2}$, this capacitor is located two stages upstream (i.e. preceding) of the stage in which transistor $Q_{nb}$ is disposed.

In the circuit shown in FIG. 7, when the clock pulse $\Phi_1$ admits of its relatively higher level during its positive half cycle, transistors $Q_{na}$ and $Q_{nb}$ both turn ON to transfer charge through both transistors from capacitor $C_{n-1}$. If the resistance of emitter resistor $R_{na}$ is equal to $R_1$ and the resistance of emitter resistor $R_{nb}$ is equal to $R_2$, then the charge flowing through transistor $Q_{nb}$ will be equal to $R_1/(R_1+R_2)$ of the charge flowing through transistor $Q_{na}$, and this charge through transistor $Q_{nb}$ is supplied to capacitor $C_{n-2}$. Transistors $Q_{n-2}$ and $Q_{nb}$ supply charge to capacitor $C_{n-2}$, and the signal corresponding to this charge is transferred through the bucket brigade device to capacitor $C_{n-1}$ during the positive half cycle of the clock pulse $\Phi_2$, that is $0.5\tau$ after this charge is transferred to capacitor $C_{n-2}$ (where $\tau$ is one clock period = $1/f_c$ and $f_c$ is the clock frequency).

The transfer function $H_4(z)$ from the signal electrode (tap $T_1$) of capacitor $C_{n-3}$ to that (tap $T_2$) of capacitor $C_n$ for the circuit shown in FIG. 7 now will be derived. The signal voltages at the signal electrodes of capacitors $C_{n-3}$, $C_{n-2}$, $C_{n-1}$, $C_n$ are assumed to be $V_{k(n-3)}$, $V_{k(n-2)}$, $V_{k(n-1)}$, $V_{k(n)}$, respectively, where $$V_k = V_{DC} + 2V_p - V_S \quad (5)$$

A charge $X_{n-2}$ flows through transistor $Q_{n-2}$ when the transistor is actuated by the positive half cycle of clock pulse $\Phi_1$, and may be expressed as:

$$X_{n-2} = V_{k(n-3)} \cdot C \cdot Z^{-\frac{1}{2}} \quad (6)$$

As before, $Z^{-1} = \epsilon^{-j\omega\tau}$, $\omega = 2\pi f$ and f is the frequency of the input signal.

At this time, a charge $X_n'$ flows through transistor $Q_{nb}$ and may be expressed as:

$$X'_n = \frac{R_1}{R_1 + R_2} X_{n-1} \cdot Z^{-1} \quad (7)$$

where $X_{n-1}$ is the charge flowing through transistor $Q_{n-1}$. Therefore, the charge supplied to capacitor $C_{n-2}$, which is equal to the charge $X_{n-1}$ flowing through transistor $Q_{n-1}$ may be expressed as:

$$X_{n-1} = X_{n-2} + X'_n \quad (8)$$

$$= V_{k(n-3)} \cdot C \cdot Z^{-\frac{1}{2}} + \frac{R_1}{R_1 + R_2} X_{n-1} \cdot Z^{-1}$$

By combining terms in equation (8) and solving for $X_{n-1}$, the result is:

$$X_{n-1} = \frac{V_{k(n-3)} \cdot C \cdot Z^{-\frac{1}{2}}}{1 - \frac{R_1}{R_1 + R_2} Z^{-1}} \quad (9)$$

The charge flowing through transistor $Q_{na}$ is a function of the voltage $V_{k(n)}$ at the signal electrode of capacitor $C_n$, and this charge may be expressed as:

$$V_{k(n)} \cdot C = X_{n-1} \cdot \frac{R_2}{R_1 + R_2} Z^{-1} \quad (10)$$

When equations (9) and (10) are combined, the result is:

$$V_{k(n)} = \frac{R_2}{R_1 + R_2} \cdot \frac{Z^{-\frac{3}{2}}}{1 - \frac{R_1}{R_1 + R_2} Z^{-1}} V_{k(n-3)} \quad (11)$$

The transfer function $H_4(z)$ is derived as:

$$H_4(z) = \frac{V_{k(n)}}{V_{k(n-3)}} = \frac{R_2}{R_1 + R_2} \cdot \frac{Z^{-\frac{3}{2}}}{1 - \frac{R_1}{R_1 + R_2} Z^{-1}} \quad (12)$$

When considering the DC levels at taps $T_1$ and $T_2$, it is assumed that $Z^{-1}$ is equal to $1 (Z^{-1} = 1)$ in equation (11). This results in:

$$[V_{k(n)}]_{DC} = \frac{R_2}{R_1 + R_2} \cdot \frac{1}{1 - \frac{R_1}{R_1 + R_2}} [V_{k(n-3)}]_{DC} \quad (12a)$$

$$= [V_{k(n-3)}]_{DC}$$

That is, it is seen that the DC level at tap $T_1$ is equal to the DC level at tap $T_2$.

Now, if it is assumed that the capacitance value of each of capacitors $C_{n-2}$ and $C_{n-1}$ is equal to $C_p$, then the charge which is transferred from capacitor $C_{n-2}$ to capacitor $C_{n-1}$ through transistor $Q_{n-1}$ is seen, from equation (9), to be:

$$C_p \cdot V_{k(n-2)} = \frac{C \cdot V_{k(n-3)} \cdot Z^{-\frac{1}{2}}}{1 - \frac{R_1}{R_1 + R_2} Z^{-1}} \quad (13)$$

To determine the DC charge which is transferred, $Z^{-1}$ in equation (13) is made equal to 1 ($Z^{-1} = 1$), resulting in:

$$C_p \cdot [V_{k(n-2)}]_{DC} = \frac{C[V_{k(n-3)}]_{DC}}{1 - \frac{R_1}{R_1 + R_2}} \quad (14)$$

If:

$$C_p = \frac{R_1 + R_2}{R_2} C \quad (15)$$

then the DC levels at the signal electrodes of all of the capacitors will be equal.

A general expression for the transfer function of the filter circuit shown in FIG. 7 may be represented as:

$$H_4(z) = Z^{-(3/2)}/(1 - bZ^{-1}) \quad (16)$$

where:

$$b = R_1/(R_1 + R_2) \quad (17)$$

and $R_1$ and $R_2$ are the resistance values for emitter resistors $R_{na}$ and $R_{nb}$, respectively.

In an alternative embodiment of the circuit shown in FIG. 7, the resistance values $R_1$ and $R_2$ of resistors $R_{na}$ and $R_{nb}$ are selected as 0 ($R_1 = R_2 = 0$), that is, these resistors are omitted, and the emitter areas of transistors $Q_{na}$ and $Q_{nb}$ are represented as $A_1$ and $A_2$, respectively. If factor b in equation (16) is expressed as:

$$b = A_2/(A_1 + A_2) \quad (18)$$

this alternative embodiment will attain the same effects as that shown in FIG. 7.

Figure 8:
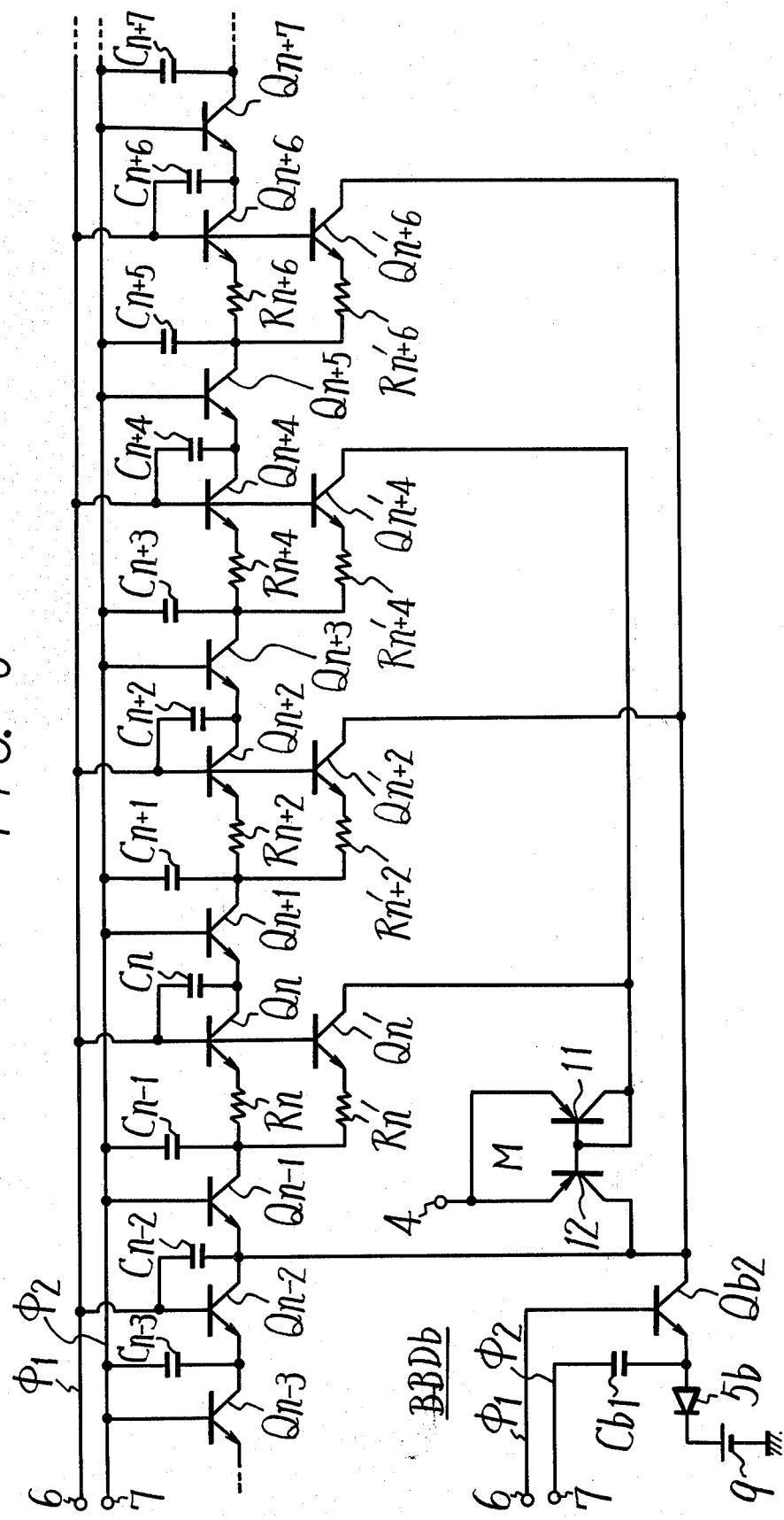

FIG. 8 illustrates a further embodiment of the invention utilizing both positive and negative feedback. As shown, the signal electrodes of capacitors $C_{1-1}$, $C_{n+1}$, $C_{n+3}$ and $C_{n+5}$, these being coupled to receive clock pulse $\Phi_2$ (and having an odd-number suffix), are connected through resistors $R_n$, $R_{n+2}$, $R_{n+4}$ and $R_{n+6}$ to the emitters of transistors $Q_n$, $Q_{n+2}$, $Q_{n+4}$ and $Q_{n+6}$, respectively. The signal electrodes of these capacitors also are connected through resistors $R'_n$, $R'_{n+2}$, $R'_{n+4}$ and $R'_{n+6}$ to the emitters of transistors $Q'_n$, $Q'_{n+2}$, $Q'_{n+4}$ and $Q'_{n+6}$, respectively. The collectors of transistors $Q'_{n+2}$ and $Q'_{n+6}$ are connected in common to the signal electrode of capacitor $C_{n-2}$, and the collectors of transistors $Q'_n$ and $Q'_{n+4}$ are connected in common through current mirror circuit M to the signal electrode of capacitor $C_{n-2}$. An additional bucket brigade device $BBD_b$, similar to that described above, includes a transistor $Q_{b2}$ whose collector is connected to the signal electrode of capacitor $C_{n-2}$.

In the circuit shown in FIG. 8, the charges flowing through the transistors $Q'_{n+2}$ and $Q'_{n+6}$ are supplied to capacitor $C_{n-2}$, and the charges flowing through transistors $Q'_n$ and $Q'_{n+4}$ are inverted and then injected into capacitor $C_{n-2}$ by current mirror circuit M.

In the transversal filter discussed above with respect to FIG. 5, when transistors $Q_{na}$ and $Q_{nb}$ both are ON, their collector-emitter voltages $V_{CE}$ differ from each other because of the so-called "early" effect, resulting in a greater charge transferred through the transistor $Q_{nb}$ than through transistor $Q_{na}$. This means that even if the emitter area ratio between transistors $Q_{na}$ and $Q_{nb}$, or their emitter current ratio, is selected to be equal, or selected to satisfy a desired, predetermined relationship, filters which appear to be identically constructed may exhibit different filter characteristics, and the characteristics of a given filter may vary with temperature variations. The "early" effect is the phenomenon whereby the collector-base voltage $V_{CB}$ of a bipolar transistor increases, and the collector depletion layer expands, resulting in a decrease in the effective base width and an increase in the emitter current, even if the base-emitter voltage $V_{BE}$ is maintained constant. If the emitter current is held constant, the early effect results in a decrease in the base-emitter voltage $V_{BE}$ as the collector-base voltage $V_{CB}$ increases.

Figure 9:
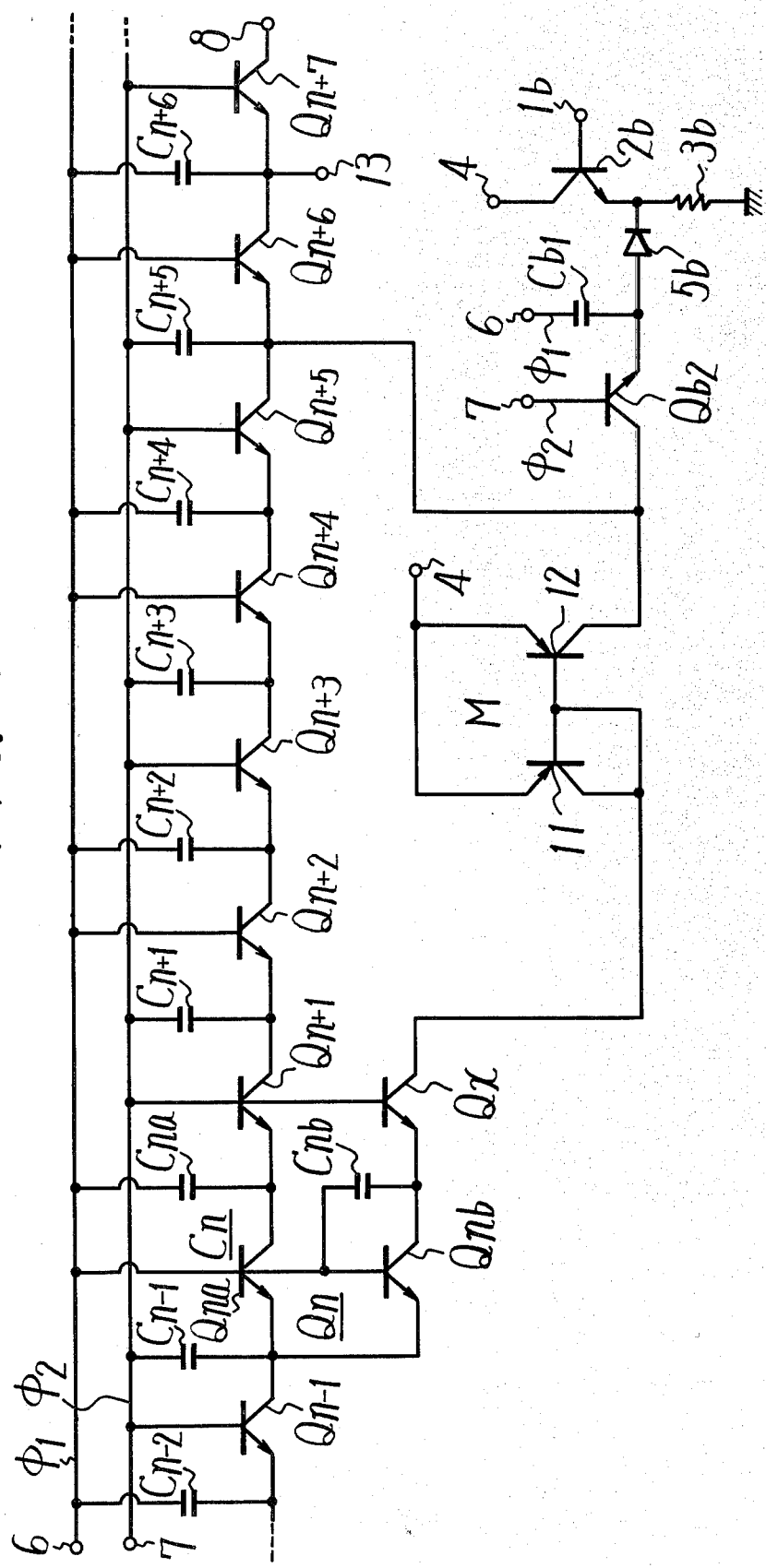

This early effect has substantially less influence on the filter characteristics of the non-recursive transversal filter shown in FIG. 9. In this embodiment, a plurality of transistors is utilized to transfer charge between intermediate taps of the charge transfer device, these transistors having emitter currents which exhibit a desired ratio, and the capacitance element in the stage which next follows one of these taps in the charge transfer device is comprised of a plurality of capacitors whose capacitances exhibit the same ratio as the aforementioned emitter current ratio. In addition, in the stage which next-follows that stage having the plural capacitors, an auxiliary transistor has its base connected in common with the usual transistor normally provided in this stage of the charge transfer device, and its emitter connected to a corresponding one of the plural capacitors.

In the non-recursive transversal filter shown in FIG. 9, transistor device $Q_n$ is comprised of two transistors $Q_{na}$ and $Q_{nb}$, and capacitance element $C_n$ is comprised of two capacitors $C_{na}$ and $C_{nb}$. The bases and emitters of transistors $Q_{na}$ and $Q_{nb}$ are connected in common, and the collector of transistor $Q_{nb}$ is connected to the emitter of an auxiliary transistor $Q_x$ (of the NPN type) whose base is connected to the base of transistor $Q_{n+1}$ which is disposed in the next-following stage of the charge transfer device. Capacitors $C_{na}$ and $C_{nb}$ are connected between the collectors and bases of transistors $Q_{na}$ and $Q_{nb}$, respectively. Transistor $Q_x$ has its collector connected to the collector of transistor 11 included in current mirror circuit M.

The emitter current ratio of transistors $Q_{na}$ and $Q_{nb}$, i.e. the ratio of their emitter areas, is equal to $A_{2a}:A_{2b}$, where $A_{2a}=A_{2b}$; and the emitter current of each of transistors $Q_{na}$ and $Q_{nb}$ is equal to ½ the emitter current of transistor $Q_{n-1}$. The capacitance ratio of capacitors $C_{na}$ and $C_{nb}$ is equal to $A_{2a}:A_{2b}$, where $A_{2a}=A_{2b}$; and the capacitance of each of capacitors $C_{na}$ and $C_{nb}$ is equal to C, that is, it is equal to the capacitance C of the other capacitors.

The collector of transistor 12 of current mirror circuit M is connected to the signal electrode of capacitor $C_{n+5}$, and an output terminal 13 is connected to the signal electrode of capacitor $C_{n+6}$ included in the next-following stage.

In the circuit illustrated in FIG. 9, the transfer function $H_5(z)$ from the signal electrode of capacitor $C_{n-1}$ to the output terminal 13 may be expressed as:

$$H_5(z) = \left( -\frac{1}{2} + \frac{1}{2} Z^{-2} \right) Z^{-\frac{3}{2}} \quad (19)$$

$$= -\frac{1}{2} Z^{-\frac{3}{2}} + \frac{1}{2} Z^{-\frac{7}{2}}$$

It is appreciated that the collector potentials of transistors $Q_{na}$ and $Q_{nb}$ are equal and, hence, the collector-emitter voltages $V_{CE}$ thereof also are equal, so that influences on the filter characteristics caused by the early effect are obviated.

Figure 10:
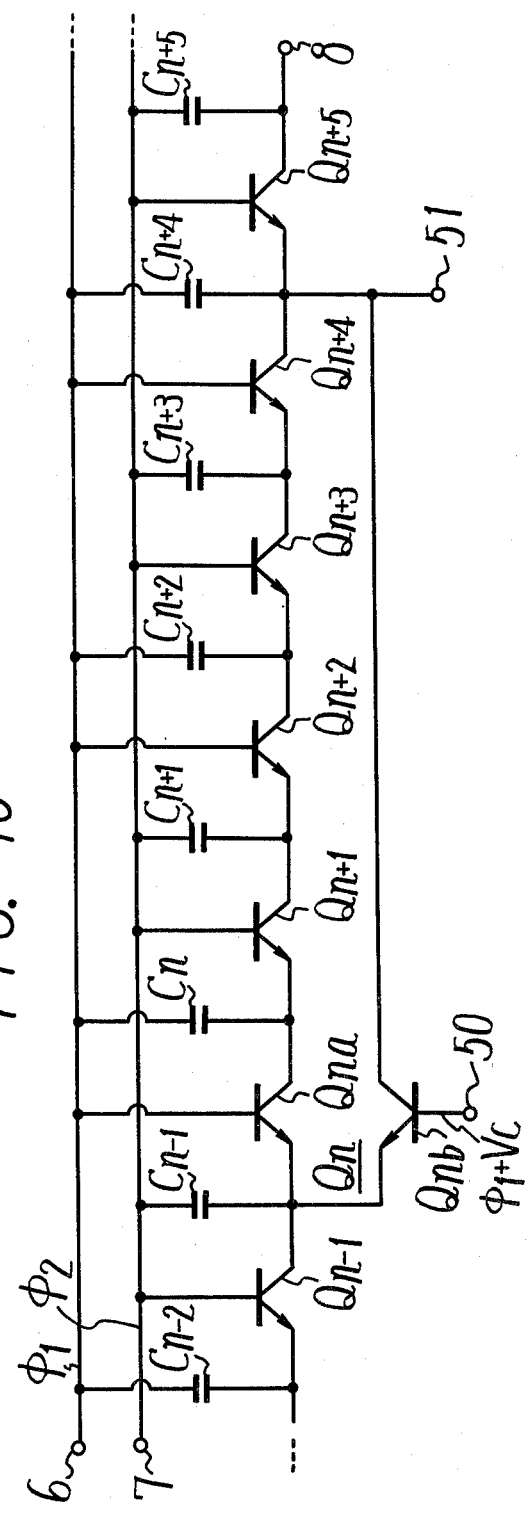

FIG. 10 illustrates yet another embodiment of a non-recursive transversal filter in accordance with the present invention. In this embodiment, transistor element $Q_n$ is comprised of two transistors $Q_{na}$ and $Q_{nb}$. A control terminal 50 is coupled to the base of transistor $Q_{nb}$, to which is supplied a clock signal comprised of clock pulse $\Phi_1$ and having a variable DC control signal $V_C$ superimposed thereon. An output terminal 51 is connected to the signal electrode of capacitor $C_{n+4}$.

The operation of the filter circuit shown in FIG. 10 now will be described. Let it be assumed that currents $I_1$ and $I_2$ flow through transistors $Q_{na}$ and $Q_{nb}$, respectively, into capacitor $C_{n-1}$ during the positive half cycle of clock pulse $\Phi_1$ (and the negative half cycle of clock pulse $\Phi_2$). It is recalled that, when transistor $Q_{na}$ is turned ON, the charge which flows into capacitor $C_{n-1}$ may be expressed as:

$$(V_{DC}+2V_p-V_S)C/\Delta t$$

where $\Delta t$ is a short time. The current flow to capacitor $C_{n-1}$ is in proportion to the above charge. If the base-emitter voltages of transistors $Q_{na}$ and $Q_{nb}$ are $V_{BE}(Q_{na})$ and $V_{BE}(Q_{nb})$, respectively, and since the emitter potentials thereof are equal, the following is established:

$$V_{DC}+V_p-V_{BE}(Q_{na})=V_{DC}+V_p-V_{BE}(Q_{nb}) \quad (20)$$

From equation (20), the following is derived:

$$V_{BE}(Q_{nb})-V_{BE}(Q_{na})=V_C \quad (21)$$

From equation (21), the following is derived:

$$(kT/q)\cdot\ln(I_2/I_S)-(kT/q)\cdot\ln(I_1/I_S)=V_C \quad (22)$$

From equation (22), $I_2/I_1$ can be expressed as:

$$I_2/I_1=(q/\epsilon^{kT})\cdot V_C \quad (23)$$

In the above equations, if kT/q is represented as h, equation (23) can be rewritten as follows:

$$I_2/I_1=V_C/\epsilon^h \quad (24)$$

When the period of the clock signals $\Phi_1$ and $\Phi_2$ is equal to $\tau$, the signal curve on capacitor $C_{n-1}$ is transferred to the signal electrode of capacitor $C_{n+4}$ through transistor $Q_{nb}$ at a time $\tau/2$ after this signal charge is stored on capacitor $C_{n-1}$, and to the signal electrode capacitor $C_{n+4}$ through transistor $Q_{na}$ (and transistors $Q_{n+1}$, $Q_{n+2}$, $Q_{n+3}$ and $Q_{n+4}$ at a time $5\tau/2$ after being stored on capacitor $C_{n-1}$. If the signal charge on capacitor $C_{n-1}$ is represented as $q_1$, the quantity of signal charge transferred through transistor $Q_{nb}$ to output terminal 51 and the quantity of signal charge transferred through transistor $Q_{na}$ to the output terminal can be expressed as:

$$q_1 \cdot \frac{\epsilon^{\frac{V_C}{h}}}{1+\epsilon^{\frac{V_C}{h}}} \cdot Z^{-\frac{1}{2}} \quad \text{(through transistor } Q_{nb}\text{)}$$

and $$q_1 \cdot \frac{1}{1+\epsilon^{\frac{V_C}{h}}} \cdot Z^{-\frac{1}{2}} \quad \text{(through transistor } Q_{na}\text{)}$$

Accordingly, the transfer function $H_6(z)$ from the signal electrode of capacitor $C_{n-1}$ to output terminal 51 can be expressed as:

$$H_6(z) = \frac{Z^{-\frac{1}{2}}}{1+\epsilon^{\frac{V_C}{h}}} \cdot \left( \epsilon^{\frac{V_C}{h}} + Z^{-2} \right) \quad (25)$$

It will be appreciated that the filter characteristics of the circuit shown in FIG. 10 can be varied as a function of the variable control signal $V_C$.

Although not shown therein, it should be readily apparent that, in the circuit of FIG. 10, successive stages, similar to those of typical bucket brigade devices, are provided following (or downstream of) transistor $Q_{n+5}$.

In equation (25), if $Z=1$, the transfer function $H_6(z)$ is equal to 1 ($H_6(z)=1$). Therefore, even if the characteristics of the filter are varied in response to the variable control signal $V_C$, the DC potentials at the signal electrode of capacitor $C_{n-1}$ and at output terminal 51 are equal to each other. Thus, it is seen that an additional DC level correcting circuit is not required.

FIG. 11 illustrates a still further embodiment of the present invention, which is similar to the filter circuit of FIG. 10, with the addition of a control signal generating circuit 58 which generates a variable control signal for varying the sensitivity factor in a linear manner. Variable control signal generating circuit 58 is comprised of NPN transistors $Q_a$, $Q_b$, $Q_c$ and $Q_d$ which constitute two stages of a differential amplifier arrangement. The collectors of transistors $Q_a$ and $Q_b$ are connected to power supply terminal 4 and their bases are connected to a common terminal 52. The emitters of transistors $Q_a$ and $Q_b$ are coupled to the collectors of transistors $Q_c$ and $Q_d$, respectively. Transistors $Q_c$ and $Q_d$ have their emitters coupled through resistors 56 and 57, respectively, each resistor having the same resistance value r/2, to a constant current circuit 55. Input terminals 53 and 54 are connected to the bases of transistors $Q_c$ and $Q_d$, respectively. The emitter of transistor $Q_a$ is connected to the base of transistor $Q_{nb}$ through terminal 50; and the emitter of transistor $Q_b$ is connected to the base of transistor $Q_{na}$. In this embodiment, the base of transistor $Q_{na}$ is not connected to clock terminal 6, as in the FIG. 10 circuit.

Terminal 52 is supplied with a composite signal which consists of the clock pulse $\Phi_1$ superimposed onto a voltage $V_{BE}$ equal to the base-emitter voltage of transistor $Q_a$. Terminals 53 and 54 are supplied with a variable DC control signal $V_C'$ thereacross, with the polarities shown in FIG. 11.

In operation, let it be assumed that the currents flowing through transistors $Q_{na}$ and $Q_{nb}$ to capacitor $C_{n-1}$ are equal to $I_1$ and $I_2$, respectively, that the collector currents through transistors $Q_d$ and $Q_c$ are equal to $I_3$ and $I_4$, respectively, and that the constant current of constant current circuit 55 is equal to $I_0$. If the constant current $I_0$ is sufficiently large as compared with the base currents of transistors $Q_a$, $Q_b$, $Q_c$ and $Q_d$, the following is established:

$$I_3 + I_4 = I_0 \qquad (26)$$

Further, if the base-emitter voltages of transistors $Q_{na}$, $Q_{nb}$, $Q_a$ and $Q_b$ are assumed to $V_{BE2}$, $V_{BEx}$, $V_{BEa}$ and $V_{BEb}$, respectively, then, $$V_{VE2} + V_{BEb} = V_{BEx} + V_{BEa} \qquad (27)$$

The variable DC control signal $V_C'$ may be expressed as:

$$V_C' = r/2(I_4 - I_3),$$

and therefore, $$I_4 - I_3 = 2V_C'/r \qquad (28)$$

Since $I_1/I_2 = I_4/I_3$, from the above equations, the following is derived:

$$\frac{I_1}{I_2} = \frac{I_0 + \frac{2V_C'}{r}}{I_0 - \frac{2V_C'}{r}} \qquad (29)$$

The quantity of signal charge transferred from the signal electrode of capacitor $C_{n-1}$ through each of transistors $Q_{na}$ and $Q_{nb}$ to the stage containing capacitor $C_{n+4}$, that is, to output terminal 51, is in proportion to the currents $I_1$ and $I_2$. If the charge on capacitor $C_{n-1}$ is assumed to be $q_1$, the quantity of signal charge transferred through transistor $Q_{na}$ to output terminal 51 is expressed as:

$$q_1 \cdot (\tfrac{1}{2} + V_C'/r \cdot I_0)$$

and the quantity of signal charge transferred through transistor $Q_{nb}$ to output terminal 51 is expressed as:

$$q_1 \cdot (\tfrac{1}{2} - V_C'/r \cdot I_0)$$

Accordingly, the transfer function $H_7(z)$ from the signal electrode of capacitor $C_{n-1}$ to output terminal 51 may be represented as:

$$H_7(z) = [(\tfrac{1}{2} + V_C'/r \cdot I_0) + (\tfrac{1}{2} - V_C'/r \cdot I_0)Z^{-2}]Z^{-\tfrac{1}{2}} \qquad (30)$$

If $Z=1$ in equation (30), $H_7(z)=1$. Thus, even though the filter characteristic may be varied as a function of the variable control signal $V_C'$, the DC potentials at the signal electrode of capacitor $C_{n-1}$ and at output terminal 51 are equal. Hence a DC level correcting circuit is not necessary.

FIG. 12 illustrates yet another embodiment of the present invention in which the circuit shown in FIG. 10 is modified to function as a recursive transversal filter. An NPN transistor $Q_n'$ is provided with its emitter connected to the signal electrode of, for example, capacitor $C_{n-1}$ and its collector connected to the signal electrode of capacitor $C_{n-2}$ of the charge transfer device. The base of transistor $Q_n'$ is connected to terminal 50 which is supplied with clock pulse $\Phi_1$ superimposed with the variable control signal $V_C$. Output terminal 51 is coupled to the signal electrode of capacitor $C_n$. Let it be assumed that the capacitance of each of capacitors $C_{n-1}$ and $C_{n-2}$ is equal to $C'$ and the capacitance of the other capacitors is equal to C. It is further assumed that capacitance $C'$ exhibits the following relationship:

$$C' \leq (1 + V_{Cm} \epsilon^h)C \qquad (31)$$

where $V_{Cm}$ is the maximum value of the variable DC control signal $V_C$. This prevents limiting the dynamic range of the signal at the signal electrodes of respective capacitors $C_{n-2}$ and $C_{n-1}$ when the recursive amount increases.

Now, if it is assumed that the amount of signal charge on each of capacitors $C_{n-3}$ to $C_n$ is represented as $q_3$ to $q_6$, respectively, when transistors $Q_{n-2}$ and $Q_n'$ are both turned ON in response to clock pulse $\Phi_1$, the charge $q_4$ on capacitor $C_{n-2}$ is calculated to be:

$$q_4 = q_3 \cdot Z^{-\tfrac{1}{2}} + q_5 \cdot \frac{\epsilon^{\tfrac{V_C}{h}}}{1 + \epsilon^{\tfrac{V_C}{h}}} \cdot Z^{-\tfrac{1}{2}} \qquad (32)$$

The charge $q_6$ at the signal electrode of capacitor $C_n$ is calculated as:

$$q_6 = q_5 \cdot \frac{1}{1 + \epsilon^{\tfrac{V_C}{h}}} \cdot Z^{-\tfrac{1}{2}} \qquad (33)$$

and the charge $q_5$ at the signal electrode of capacitor $C_{n-1}$ is calculated as:

$$q_5 = q_4 \cdot Z^{-\tfrac{1}{2}} \qquad (34)$$

From equations (32), (33) and (34) the transfer function $H_8(z)$ from the signal electrode of capacitor $C_{n-3}$ to output terminal 51 can be expressed as follows:

$$H_8(z) = \frac{q_6}{q_3} = \frac{1}{\left(1 + \epsilon^{\frac{VC}{h}}\right)} \cdot \frac{1}{1 - \epsilon^{\frac{VC}{h}}} \cdot z^{-\frac{3}{2}} \quad (35)$$
$$\left(1 + \epsilon^{\frac{VC}{h}}\right)$$

In equation (35), if $Z=1$, $H_8(z)=1$. Therefore, it is seen that even when the filter characteristic of the illustrated recursive transversal filter is varied by variable control signal $V_C$, the DC potentials at the signal electrode of capacitor $C_{n-4}$ and at output terminal 51 are equal; and, hence a DC level correcting circuit is not necessary.

From the foregoing it is seen that, in accordance with the present invention, a transversal filter is provided which is of relatively simple construction and whose filter characteristic is easily varied by a control signal. Since the use of emitter-follower transistors for deriving output signals from various taps of the charge transfer circuit is avoided, the charge transfer efficiency is not reduced due to the base currents of such emitter-follower transistors; and the dynamic range of the filtered signal is not lowered because of the influence of the collector-base capacitance of such transistors. Furthermore, sample-and-hold circuits, which heretofore were used in, for example, recursive transversal filters, are not needed. If the output from the filter of the present invention is supplied to other charge transfer devices, such as bucket brigade devices, DC level correcting circuitry is not necessary. Therefore, the present invention exhibits good DC coupling characteristics, is relatively inexpensive to manufacture and consumes less power.

Whereas sample-and-hold circuits are not used, sampling distortions such as sample jitter, aperture distortion or the like, are not present.

While the present invention has been particularly shown and described with reference to certain preferred embodiments, it will be appreciated that various changes and modifications may be made without departing from the spirit and scope of the invention. For example, the charge transfer device which has been described to transfer, or shift, charge from stage-to-stage in response to clock pulses $\Phi_1$ and $\Phi_2$, is shown as a bucket brigade device. Other known charge transfer circuits may be used, as desired. Likewise, although bipolar transistors have been described as the switching elements to transfer charge from one stage to the next, other switching devices, such as MOS-type field effect transistors, junction type FET's and the like may be used. If bipolar transistors are preferred, they may, alternatively, be PNP transistors. Similarly other storage devices may be used in place of capacitors to temporarily store analog signals as such temporarily stored signals are transferred from stage-to-stage. Also, while two sets of storage elements, and two sets of switching elements are shown as being supplied with and actuated by clock pulses $\Phi_1$ and $\Phi_2$ which are 180° out-of-phase with each other, three sets of these elements may be provided if clock pulses $\Phi_1$, $\Phi_2$ and $\Phi_3$, being 120° out-of-phase, are used, four sets may be provided if clock pulses $\Phi_1$, $\Phi_2$, $\Phi_3$ and $\Phi_4$, being 90° out-of-phase, are used, and so on. Furthermore, depending upon the particular filtering characteristics which is desired, a suitable number of stages in the charge transfer device may be provided, and taps may be connected to selected stages to derive output signals therefrom which, when combined as described above, produce desired transfer functions $H(z)$.

Therefore, it is intended that the appended claims be interpreted as including the foregoing and other such changes and modifications.

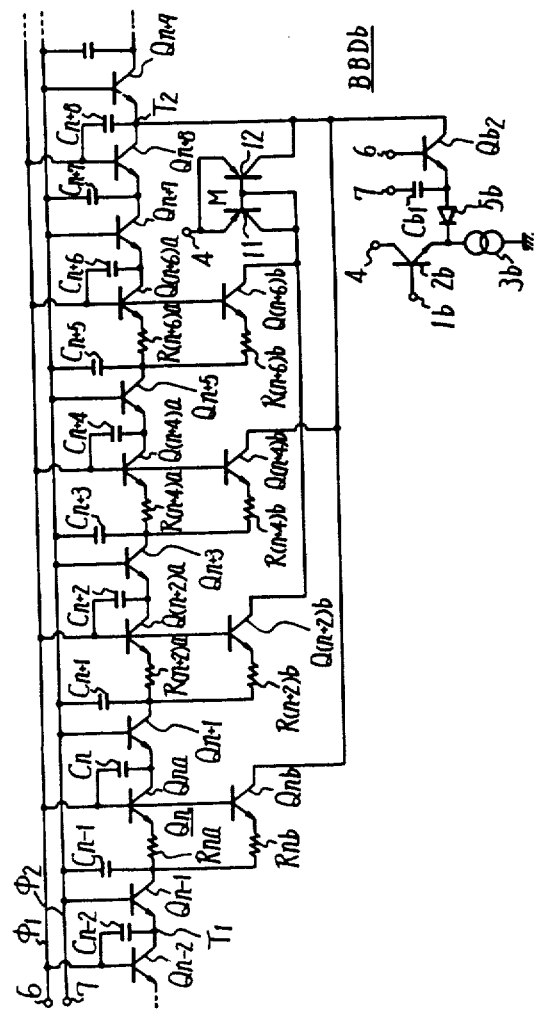

What is claimed is:

1. A filter circuit comprising charge transfer means, including first and second sets of charge storage means, said first set of charge storage means being supplied with a first clock signal and said second set of charge storage means being supplied with a second clock signal, first and second sets of switch means, said first set of switch means being actuated in response to said first clock signal and said second set of switch means being actuated in response to said second clock signal, respective ones of said switch means in said first set being operable when actuated to transfer charge between a charge storage means in said first set and a charge storage means in said second set and respective ones of said switch means in said second set being operable when actuated to transfer charge between a charge storage means in said second set and a charge storage means in said first set, and means for supplying said first and second clock signals to said first and second sets of charge storage means, respectively, and to said first and second sets of switch means, respectively, thereby transferring a charge through succeeding switch means to be temporarily stored in succeeding charge storage means; means for supplying an input signal to a predetermined one of said charge storage means; semiconductor means actuated in response to a selected one of said first or second clock signals for transferring the charge stored in a predetermined first charge storage means to a predetermined second charge storage means, said predetermined first charge storage means and said predetermined second charge storage means being selected from any of said first and second sets of charge storage means; and output means coupled to a preselected charge storage means, which is selected from said first and second sets of charge storage means, for deriving an output signal from said filter circuit.

2. The filter circuit of claim 1 wherein each of said charge storage means comprises a capacitor, the capacitors of said first set having respective first electrodes coupled in common to receive said first clock signals and also having respective signal electrodes, and the capacitors of said second set having respective first electrodes coupled in common to receive said second clock signals and also having respective signal electrodes; and wherein each of said switch means is interconnected between the signal electrodes of two capacitors of different sets.

3. The filter circuit of claim 2 wherein each of said switch means comprises transistor means having its collector-emitter circuit coupled between said signal electrodes of two capacitors of different sets, the transistor means of said first set having respective base electrodes coupled in common to receive said first clock signals, and the transistor means of said second set having respective base electrodes coupled in common to receive said second clock signals.

4. The filter circuit of claim 3 wherein a respective capacitor of said first set is connected between the base and collector electrodes of a respective transistor means of said first set; and a respective capacitor of said second set is connected between the base and collector electrodes of a respective transistor means of said second set.

5. The filter circuit of claim 3 wherein said first and second clock signals are 180° out-of-phase with each other.

6. The filter circuit of claim 1 wherein said semiconductor means comprises transistor means having its collector-emitter circuit connected between said predetermined first and second charge storage means, and its base electrode connected to receive said selected clock signal.

7. The filter circuit of claim 6 wherein said transistor means has its emitter electrode connected to said predetermined first charge storage means and its collector electrode connected to said predetermined second charge storage means, the latter being supplied with the same clock signal as said transistor means.

8. The filter circuit of claim 7 wherein said transistor means transfers charge from said predetermined first charge storage means to said predetermined second charge storage means, the latter being in succeeding relationship to the former charge storage means.

9. The filter circuit of claim 8, further comprising a current mirror circuit for injecting charge into said predetermined second charge storage means from the immediately preceding switch means which transfers that charge.

10. The filter circuit of claim 9, further comprising additional charge transfer means supplied with the DC component of said input signal, said additional charge transfer means being coupled to said second charge storage means.

11. The filter circuit of claim 7 wherein said switch means comprise transistor switches, the emitter of one of said transistor switches being coupled to said predetermined first charge storage means and the base of said one transistor switch being supplied with the same clock signal as said transistor means.

12. The filter circuit of claim 11 wherein said transistor means and said one transistor switch exhibit balanced operation such that the emitter currents thereof exhibit a predetermined ratio.

13. The filter circuit of claim 12 wherein said transistor means and said one transistor switch are coupled to respective emitter resistances.

14. The filter circuit of claim 7, further comprising plural transistor means, some of said plural transistor means having their collector electrodes coupled in common to said predetermined second charge storage means; a current mirror circuit; others of said plural transistor means having their collector electrodes coupled in common through said current mirror circuit to said predetermined second charge storage means; each of said transistor means having its emitter electrode coupled to a respective, predetermined first charge storage means and its base electrode connected in common to receive said selected clock signal.

15. The filter circuit of claim 14 wherein said predetermined second charge storage means is in succeeding relationship to each of said predetermined first charge storage means.

16. The filter circuit of claim 14 wherein said predetermined second charge storage means is in preceding relationship to each of said predetermined first charge storage means.

17. The filter circuit of claim 7 wherein said transistor means transfers charge from said predetermined first charge storage means to said predetermined second charge storage means, the latter being in preceding relationship to the former charge storage means.

18. The filter circuit of claim 6, wherein said transistor means comprises first and second transistors having their collector-emitter circuits connected in series; said first transistor having its base electrode connected to receive one of said clock signals and said second transistor having its base electrode connected to receive the other of said clock signals.

19. The filter circuit of claim 18, further comprising an additional charge storage means coupled to the junction defined by said first and second transistors and connected to be supplied with said one clock signal.

20. The filter circuit of claim 19 further comprising a current mirror circuit; the series-connected collector-emitter circuits of said first and second transistors being coupled to said predetermined second charge storage means through said current mirror circuit.

21. The filter circuit of claim 20 wherein the emitter electrode of said first transistor is coupled to said predetermined first charge storage means and the collector electrode of said second transistor is coupled to said current mirror circuit.

22. The filter circuit of claim 20 wherein said switch means comprise transistor switches, the emitter electrode of one of said transistor switches being coupled to said predetermined first charge storage means, the base electrode of said one transistor switch being supplied with said one clock signal, and the collector electrode of said one transistor switch being connected to an immediately succeeding charge storage means; said additional and immediately succeeding charge storage means having substantially equal charge storage capacities.

23. The filter circuit of claim 7, further comprising means for supplying a control signal to said transistor means to control the filter characteristics of said filter.

24. The filter circuit of claim 23, wherein said control signal is supplied to said base electrode of said transistor means in superimposition with said selected clock signal.

25. The filter circuit of claim 24, wherein said predetermined second charge storage means is in succeeding relationship to said predetermined first charge storage means.

26. The filter circuit of claim 24, wherein said predetermined second charge storage means is in preceding relationship to said predetermined first charge storage means.

27. The filter circuit of claim 24 wherein said means for supplying a control signal comprises differential amplifier means connected to receive said selected clock signal and said control signal, said differential amplifier means having an output coupled to said base electrode of said transistor means.

28. The filter circuit of claim 27 wherein said differential amplifier means comprises a first pair of differentially-connected transistors supplied with said selected clock signal; a second pair of differentially-connected transistors supplied with said control signal thereacross, the collector-emitter circuits of respective ones of said first pair of differentially-connected transistors being connected in series with the collector-emitter circuits of respective ones of said second pair of differentially-connected transistors; constant current means connected to the collector-emitter circuits of said first and second pairs of differentially-connected transistors; and an output coupled to the collector circuit of one of said second pair of differentially-connected transistors.

29. The filter circuit of claim 28 wherein said switch means comprise transistor switches, the emitter electrode of one of said transistor switches being coupled to said predetermined first charge storage means, the collector electrode of said one transistor switch being connected to an immediately succeeding charge storage means, and the base electrode of said one transistor switch being coupled to the collector circuit of the other of said second pair of differentially-connected transistors.

30. A filter circuit comprising charge transfer means including plural stages of capacitance means for storing charge, plural transistor switches, each transistor switch interconnecting the capacitance means of one stage to the capacitance means of a succeeding stage such that, when a transistor switch is conductive, a signal charge is transferred through the collector-emitter circuit thereof from one stage to the next succeeding stage, means for supplying first clock signals to alternate ones of said transistor switches to actuate same and second clock signals to the remaining transistor switches to actuate the latter, means for supplying an input signal to an input stage and means for deriving an output signal from an output stage; charge transfer transistor means having a collector-emitter circuit interconnected between at least a first stage and a second stage to transfer charge therebetween when actuated; and means for supplying a selected one of said clock signals to said charge transfer transistor means to actuate the same.

31. The filter circuit of claim 30 wherein said charge transfer transistor means transfers charge from said first stage to said second stage, the latter being a succeeding stage relative to said first stage.

32. The filter circuit of claim 30 wherein said charge transfer transistor means transfers charge from said first stage to said second stage, the latter being a preceding stage relative to said first stage.

33. The filter circuit of claim 30, further comprising means interconnected between said second stage and the transistor switch which transfers signal charge thereto for inverting and injecting said signal charge to said second stage.

34. The filter circuit of claim 33 wherein said last-mentioned means comprises a current mirror circuit.

35. The filter circuit of claim 30 wherein said charge transfer transistor means comprises plural charge transfer transistors, each connected to a respective stage and to said second stage, all of said charge transfer transistors being actuated simultaneously to transfer charge from said respective stage to said second stage.

36. The filter circuit of claim 35, further comprising means for inverting and injecting the charge transferred by some of said charge transfer transistors to said second stage.

37. The filter circuit of claim 36 wherein said last-mentioned means comprises a current mirror circuit having an input coupled in common to the collector-emitter circuit of said some charge transfer transistors and an output coupled to said second stage; and wherein the collector-emitter circuits of the remaining ones of said charge transfer transistors are coupled to said second stage.

38. The filter circuit of claim 30 wherein said charge transfer transistor means comprises plural charge transfer transistors having their collector-emitter circuits connected in series, one of said charge transfer transistors being supplied with said first clock signal and another of said charge transfer transistors being supplied with said second clock signal; and an additional capacitance means coupled to one of said charge transfer transistors to receive at least a portion of the signal charge from said first stage, which portion is transferred thereto by said one charge transfer transistor.

39. The filter circuit of claim 38 further comprising means for inverting and injecting the charge transferred to said second stage by said plural charge transfer transistors.

40. The filter circuit of claim 39 wherein said last-mentioned means comprises a current mirror circuit.

41. The filter circuit of claim 30 further comprising means for supplying a control voltage to said charge transfer transistor means for controlling the charge transferred to said second stage.

42. The filter circuit of claim 41 wherein said means for supplying a control voltage comprises differential amplifier means supplied with said selected clock signals and with said control voltage to superimpose said selected clock signals on said control voltage and to supply same to a control electrode of said charge transfer transistor means.

43. The filter circuit of claim 42 wherein said differential amplifier means also is coupled to the transistor switch which transfers charge from said first stage to the next succeeding stage to control the actuation thereof.

* * * * *

UNITED STATES PATENT AND TRADEMARK OFFICE
CERTIFICATE OF CORRECTION

PATENT NO. : 4,405,908

DATED : September 20, 1983

INVENTOR(S) : Mitsuo Soneda

It is certified that error appears in the above-identified patent and that said Letters Patent is hereby corrected as shown below:

The title page should be deleted to appear as per attached title page.

Signed and Sealed this

Eighth Day of May 1984

[SEAL]

*Attest:*

GERALD J. MOSSINGHOFF

*Attesting Officer*  *Commissioner of Patents and Trademarks*

United States Patent [19]
Soneda

[11] 4,405,908
[45] Sep. 20, 1983

[54] FILTER CIRCUIT HAVING A CHARGE TRANSFER DEVICE

[75] Inventor: Mitsuo Soneda, Fujisawa, Japan
[73] Assignee: Sony Corporation, Tokyo, Japan
[21] Appl. No.: 255,161
[22] Filed: Apr. 17, 1981

[30] Foreign Application Priority Data

| Apr. 11, 1980 [JP] | Japan | 55/48478 |
| Apr. 15, 1980 [JP] | Japan | 55/49660 |
| Sep. 16, 1980 [JP] | Japan | 55/128179 |
| Sep. 26, 1980 [JP] | Japan | 55/134610 |

[51] Int. Cl.³ .................... H03H 15/02; G11C 27/00; G11C 27/02
[52] U.S. Cl. ................... 333/165; 333/173; 333/166; 377/61
[58] Field of Search ............ 333/165, 166, 173; 357/24; 307/221 D, 221 R, 221 C, 221 B; 328/151, 165, 167; 377/57-63, 75-77, 80

[56] References Cited

U.S. PATENT DOCUMENTS

| 3,474,260 | 10/1969 | Frohbach | 307/221 D |
| 3,740,577 | 6/1973 | Sangster | 307/221 D |
| 3,916,219 | 10/1975 | Wilmsmeyer | 307/221 D X |

Primary Examiner—Marvin L. Nussbaum
Attorney, Agent, or Firm—Lewis H. Eslinger; Alvin Sinderbrand

[57] ABSTRACT

A filter circuit comprising a charge transfer device of the type which includes first and second sets of charge storage devices, such as capacitors, the first and second sets of charge storage devices being supplied with first and second clock signals, respectively, and further including first and second sets of switches which are actuated in response to the first and second clock signals, respectively, each switch being operable, when actuated, to transfer charge between a charge storage device in one set and a charge storage device in the other set, thereby transferring a charge through succeeding switches to be temporarily stored in succeeding charge storage devices. A semiconductor element, such as a transistor, is actuated in response either to the first or to the second clock signals for transferring the charge stored in a first predetermined charge storage device to a second predetermined charge storage device. An output circuit is coupled to a preselected charge storage device for deriving an output signal from the filter circuit.

43 Claims, 15 Drawing Figures